ETCH MASKS ON SEMICONDUCTOR SURFACES

Filed April 8, 1966

INVENTORS A. A. BERGH
W. van GELDER
BY H. W. Lockhart
ATTORNEY

United States Patent Office 3,479,237
Patented Nov. 18, 1969

3,479,237

ETCH MASKS ON SEMICONDUCTOR SURFACES

Arpad A. Bergh, Bethlehem, and Willem van Gelder, Allentown, Pa., assignors to Bell Telephone Laboratories, Incorporated, New York, N.Y., a corporation of New York Filed Apr. 8, 1966, Ser. No. 541,173
Int. Cl. C23f *1/02;* H01l *7/00*
U.S. Cl. 156—11 3 Claims

ABSTRACT OF THE DISCLOSURE

Patterns are etched in coatings of silicon nitride, aluminum oxide, or aluminum silicate by forming phosphoric acid resistant masks in silicon oxide, molybdenum or platinum using conventional photoresist procedures.

Figure 1:
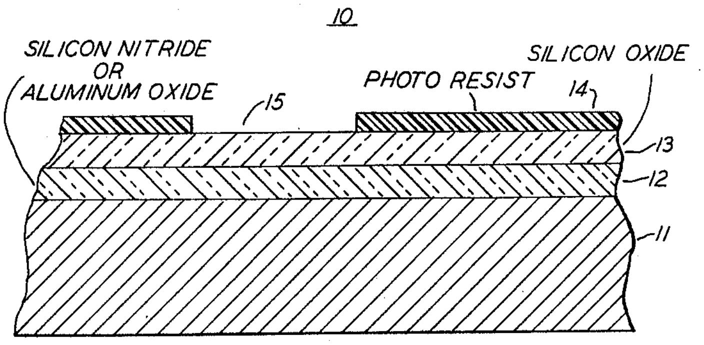

This invention relates to semiconductor devices and particularly to the formation of dielectric layers in accordance with particular patterns on surfaces of semiconductor bodies.

The use of dielectric coatings to mask diffusions and depositions, as well as to provide protection during and after fabrication is well known. These techniques are particularly well developed for the fabrication of planar semiconductor devices and for field effect semiconductor devices of various types. For a considerable period silicon oxide has been widely used as a dielectric coating on a variety of semiconductor substrates. Silicon oxide is particularly advantageous for this purpose because it is etched by hydrofluoric acid which does not attack the standard organic photoresist materials used to define etch patterns on a dielectric coating.

Recently several different dielectric materials have become of considerable interest for use in place of silicon oxide. In particular silicon nitride, aluminum oxide, and certain mixed oxides, in particular aluminum silicate, have been found to provide certain advantages both as diffusion and deposition masks, for long-term protective purposes, and enhanced initial device characteristics.

However, none of these materials is susceptible to substantial etching by hydrofluoric acid in the manner of silicon oxide. They are readily etched using hot phosphoric acid which then raises the problem that this etchant also attacks the usual organic photoresist coatings used to define the etch patterns.

Accordingly, an object of this invention is a procedure for producing conveniently, masking patterns in dielectric coatings of silicon nitride, aluminum oxide, or aluminum silicate.

In particular, in accordance with an embodiment of this invention a layer of silicon oxide is deposited over a layer of silicon nitride. A photoresist etch mask then is produced on top of the silicon oxide layer to define the desired dielectric pattern. The body is then treated in the usual hydrofluoric acid solution which removes the unmasked silicon oxide, exposing underlying portions of the silicon nitride layer. The hydrofluoric acid, of course, does not attack substantially the underlying dielectric coating.

Next the body is treated with hot phosphoric acid which does attack the underlying nitride coating in those portions which are not covered by silicon oxide. Where silicon oxide covers the underlying layer no substantial etching occurs, and as a result the pattern originally defined in the photoresist material is produced in the silicon nitride coating.

In another embodiment, a molybdenum or platinum layer is used in place of silicon oxide and is etched using nitric acid or aqua regia, respectively, which again does not attack either the photoresist or the underlying dielectric coating.

A feature of the method of this invention is that an additional layer is provided which is shaped by the conventional photoresist method and which then acts as a mask for the etching of the underlying dielectric layer.

Figure 2:
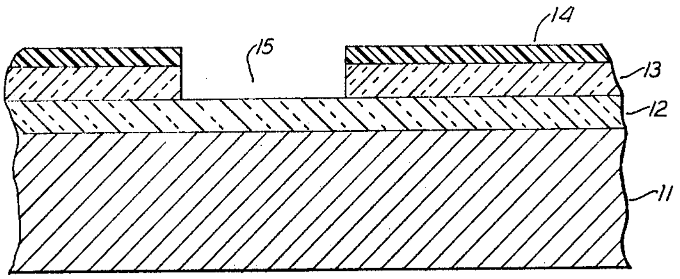
Figure 3:
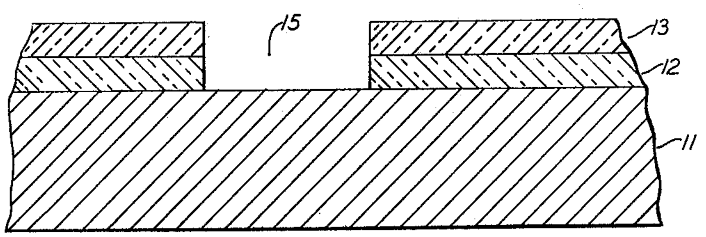

The invention and its other objects and features will be more clearly understood from the following detailed description taken in conjunction with the drawing in which:

FIGURES 1, 2 and 3 show in partial cross section the successive steps in the masked etching method in accordance with this invention.

Referring to FIG. 1 the element 10 comprises a portion of a silicon semiconductor slice in which the substrate 11 is single crystal silicon which may include a layer formed by epitaxial deposition. On one surface of the silicon body a layer 12 of silicon nitride is formed by deposition techniques already know in the art. In particular silicon nitride coatings are formed by a treatment in which silane ($SiH_4$) and ammonia ($NH_3$) are mixed in a carrier gas stream of hydrogen and introduced into a chamber containing the silicon body at a temperature of about from 850 to 900 degrees centigrade. A reaction occurs involving the decomposition of the silane and the synthesis of the silicon nitride which is deposited on the silicon surface. In an alternative method a lower temperature plasma reaction of the type described in the copending application Ser. No. 446,470 filed Mar. 29, 1965 by J. R. Ligenza, now Patent 3,287,243, and assigned to the same assignee as this invention, may be used. Typically, a silicon nitride layer having a thickness of about 1000 angstroms is produced.

In another embodiment in which the layer 12 is aluminum oxide suitable deposition techniques are known also. For example, one method involves the introduction of a hydrogen gas stream containing a quantity of aluminum trichloride into a chamber where it is mixed with carbon dioxide at a temperature of about 1000 degrees centigrade. Suitable coatings of aluminum oxide are deposited on semiconductor bodies within the chamber and for the purposes of this invention are about 2000 to 3000 angstroms thick.

On the other hand, the layer 12 may be a mixed oxide such as aluminum silicate made by adding to the aluminum trichloride of the foregoing described process for depositing aluminum oxide, a quantity of silicon tetrachloride.

A second layer 13 of material resistant to the etchant, phosphoric acid, and susceptible to the etchants used in the conventional organic photoresist techniques, is deposited over the layer 12. In a preferred embodiment this layer 13 is silicon oxide having a thickness of 2000 to 3000 angstroms. A suitable silicon oxide layer may be deposited using a well-known process based on reacting a mixture of hydrogen and silicon tetrachloride and carbon dioxide.

Finally on top of the silicon oxide layer a photoresist mask 14 is provided in accordance with techniques such as are described in Patent 3,122,817 to J. Andrus. Referring to FIG. 1 the photoresist layer 14 is shown developed so as to expose the opening 15 in the mask.

Referring next to FIG. 2, the semiconductor element 10 is treated in a solution of buffered hydrofluoric acid so as to remove the unmasked portions of silicon oxide layer 13 and thus extend the opening of window 15 to the surface of the dielectric layer 12. Inasmuch as the hydrofluoric acid solution does not substantially attack silicon nitride, aluminum oxide, or aluminum silicate the etching treatment terminates upon the removal of the unmasked silicon oxide.

Alternatives for the silicon oxide layer 13 comprise layers of molybdenum and platinum. Both of these materials are effective masks against phosphoric acid and are susceptible to selective etching using photoresist coatings. Molybdenum is etched by nitric acid and platinum by aqua regia mixtures.

Finally, referring to FIG. 3, the formation of the mask is completed by treating the body with a solution of hot phosphoric acid which does attack the portion of the dielectric layer 12 not covered by the silicon oxide layer 13. Incidentally this etchant attacks the photoresist coating 14 which is no longer effective as an etch mask at this juncture. It also attacks the silicon oxide, but at a much lower rate so that it remains effective as a mask. Accordingly a selective etching process has been disclosed for the convenient production of masks in silicon nitride, aluminum oxide and aluminum silicate. Moreover, it will be understood that other departures from the specific teaching may be devised by those skilled in the art which likewise will fall within the scope and spirit of the invention.

In particular, the improved dielectric layer 12 of silicon nitride, aluminum oxide or a mixed oxide such as aluminum silicate need not be applied in immediate contact with the semiconductor surface. In particular, this coating may cover a layer of silicon oxide applied on the semiconductor surface. The mask pattern then may be carried through to this underlying layer of silicon oxide using the hydrofluoric acid etch and the dielectric layer 12 as a mask.

What is claimed is:

1. The method of producing a dielectric layer on the surface of a slicon semiconductor body in accordance with a particular pattern comprising forming on said surface a first layer of material selected from the group consisting of silicon nitride, aluminum oxide, and aluminum silicate, forming on said first layer a layer of silicon oxide, forming on said silicon oxide layer a photoresist layer, forming a mask on the surface of said silicon oxide layer in accordance with said particular pattern by selective removal of portions of said photoresist layer thereby to expose surface portions of said silicon oxide layer, applying a solution of hydrofluoric acid to said masked surface to form said particular pattern in the silicon oxide layer by selective removal of portions of said silicon oxide layer thereby to expose surface portions of said first layer, and applying a solution of phosphoric acid to the masked surface to define said particular pattern in said first layer of material by selective removal of portions of said first layer.

2. The method of producing a dielectric layer on the surface of a silicon semiconductor body in accordance with a particular pattern comprising forming on said surface a first layer of material selected from the group consisting of silicon nitride, aluminum oxide, and aluminum silicate, forming on said first layer a layer of molybdenum, forming on said molybdenum layer a photoresist layer, forming a mask on the surface of said molybdenum layer in accordance with said particular pattern by selective removal of portions of said photoresist layer thereby to expose surface portions of said molybdenum layer, applying a solution of nitric acid to said masked surface to form said particular pattern in the molybdenum layer by selective removal of portions of said molybdenum layer thereby to expose surface portions of said first layer, and applying a solution of phosphoric acid to the masked surface to define said particular pattern in said first layer of material by selective removal of portions of said first layer.

3. The method of producing a dielectric layer on the surface of a silicon semiconductor body in accordance with a particular pattern comprising forming on said surface a first layer of material selected from the group consisting of silicon nitride, aluminum oxide, and aluminum silicate, forming on said first layer a layer of platinum, forming on said platinum layer a photoresist layer, forming a mask on the surface of said platinum layer in accordance with said particular pattern by selective removal of portions of said photoresist layer thereby to expose surface portions of said platinum layer, applying a solution of aqua regia to said masked surface to form said particular pattern in the platinum layer by selective removal of portions of said platinum layer thereby to expose surface portions of said first layer, and applying a solution of phosphoric acid to the masked surface to define said particular pattern in said first layer of material by selective removal of portions of said first layer.

References Cited

UNITED STATES PATENTS 3,406,043 10/1968 Balde -------------- 117—212

JACOB H. STEINBERG, Primary Examiner

U.S. Cl. X.R.

96—36.2; 117—212; 148—1.5, 187; 156—17